United States Patent
Weitzel et al.

[11] Patent Number: 6,127,272
[45] Date of Patent: Oct. 3, 2000

[54] METHOD OF ELECTRON BEAM LITHOGRAPHY ON VERY HIGH RESISTIVITY SUBSTRATES

[75] Inventors: Charles E. Weitzel, Mesa; Karen E. Moore, Phoenix, both of Ariz.

[73] Assignee: Motorola, Inc., Schaumburg, Ill.

[21] Appl. No.: 09/013,271

[22] Filed: Jan. 26, 1998

[51] Int. Cl.[7] .......................... H01L 21/301; H01L 21/338
[52] U.S. Cl. ..................... 438/694; 438/700; 438/703; 438/167; 438/571; 438/576
[58] Field of Search .................. 438/167, 39, 40, 438/41, 164, 949, 570, 571, 576, 694, 700, 718, FOR 122, FOR 123, FOR 134, FOR 335, FOR 336, FOR 388, FOR 394, FOR 395, FOR 396, FOR 423

[56] References Cited

U.S. PATENT DOCUMENTS

| | | | |
|---|---|---|---|
| 4,104,672 | 8/1978 | Dilorenzo et al. | 257/275 |
| 4,109,029 | 8/1978 | Ozdemir et al. | 438/949 |
| 4,131,910 | 12/1978 | Hartman et al. | 257/527 |
| 4,317,125 | 2/1982 | Hughes et al. | 438/164 |
| 5,698,900 | 12/1997 | Bozada et al. | 257/744 |

*Primary Examiner*—Mary Wilczewski
*Assistant Examiner*—Yung A. Lin
*Attorney, Agent, or Firm*—Robert F. Hightower

[57] ABSTRACT

A method of performing electron beam lithography on high resistivity substrates including forming semiconductor material on a high resistivity substrate and etching the semiconductor material to form mesas with electrically interconnecting bridges between the mesas. Semiconductor devices are formed in the mesas employing electron beam lithography and charges generated by the electron beam lithography are dispersed along the interconnecting bridges thereby preventing charge accumulation on the mesas. The bridges are removed by etching or sawing during die separation.

22 Claims, 4 Drawing Sheets

Ngày 6,127,272

METHOD OF ELECTRON BEAM LITHOGRAPHY ON VERY HIGH RESISTIVITY SUBSTRATES

FIELD OF THE INVENTION

The present invention relates to the fabrication of semiconductor devices, and more particularly to the use of electron beam lithography during semiconductor device fabrication.

BACKGROUND OF THE INVENTION

During fabrication of semiconductor devices, electron beam lithography is often used to pattern very small high resolution features with very accurate pattern registration. However, many devices are now being formed employing electrically isolated mesa structures. These mesa structures are often separated and isolated by very high resistivity material. Electrically isolated mesas present a very unique problem when employing electron beam lithography.

The very high resistivity material isolating the mesa structures causes a charge to accumulate during the electron beam writing or patterning step. As the accumulated charge in the mesa becomes larger, the electron beam can be deflected resulting in pattern distortion. Distortion of the electron beam degrades both resolution and registration.

It would be highly advantageous, therefore, to remedy the foregoing and other deficiencies inherent in the prior art.

Accordingly, it is an object of the present invention to provide a new and improved method of employing electron beam lithography on very high resistivity substrates.

Another object of the invention is to provide a method of employing electron beam lithography on electrically isolated mesa structures.

A further object of the present invention is to provide a method of employing electron beam lithography on electrically isolated mesa structures while maintaining high resolution and accurate pattern registration.

SUMMARY OF THE INVENTION

Briefly, to achieve the desired objects of the instant invention in accordance with a preferred embodiment thereof, provided is a method of performing electron beam lithography on high resistivity substrates including providing a high resistivity structure, etching the structure to form mesas and electrically interconnecting the mesas with lower resistivity material. Semiconductor devices are formed in the mesas employing electron beam lithography. Charges generated by electron beam lithography are dispersed by the lower resistivity material thereby preventing charge accumulation on the mesas. The lower resistivity material is removed leaving isolated mesas.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 2:
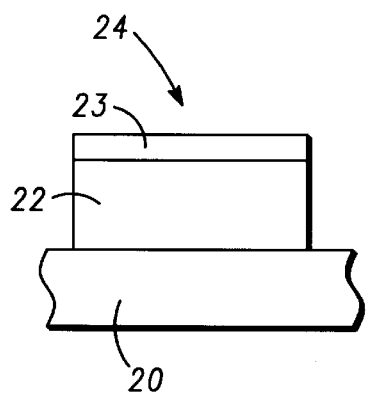
FIGS. 2, 4, 6, 8, 10, 12, and 14 are sectional views taken along lines 2—2, 4—4, 6—6, 8—8, 10—10, 12—12, and 14—14 of FIGS. 1, 3, 5, 7, 9, 11, and 13, respectively.
Figure 1:
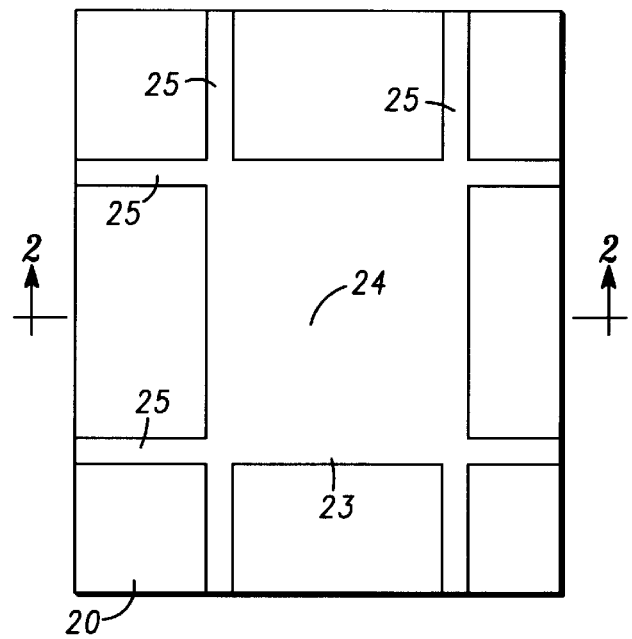
FIGS. 1, 3, 5, 7, 9, 11, and 13 are top plan views with portions broken away, illustrating sequential steps in a process employing electron beam lithography on very high resistivity substrates in accordance with the present invention.

Turning now to the drawings in which like reference characters indicate corresponding elements throughout the several views, attention is first directed to FIGS. 1 and 2 which illustrate initial steps in a process employing electron beam lithography on very high resistivity substrate 20, in accordance with the present invention. The initial step of providing a high resistivity structure includes providing high resistivity substrate 20 and can further include one or more layers formed on substrate 20. It should be understood that the terms "high resistivity structure" and "high resistivity substrate" include semi-insulating substrates, insulating substrates, and substrates with a resistivity high enough to cause charging, or undesirable charge accumulation, during electron beam lithography. In the preferred embodiment, a lightly doped layer 22 is formed on substrate 20 and a heavily doped layer 23 is formed on layer 22. It should be noted that while layer 23 is the primary low resistivity material, layer 22 has lower resistivity than substrate 20 and also aids in the conduction of charges as will be understood presently. Layers 22 and 23 can be formed using any conventional methods such as being epitaxially grown, ion implanted, or diffused. While in the preferred embodiment substrate 20 includes silicon carbide, other high resistivity materials may be employed such as gallium nitride, sapphire, spinel, silicon dioxide on silicon, and glass.

Still referring to FIGS. 1 and 2, layers 22 and 23 are etched to form mesas 24 with electrically interconnecting bridges 25 extending between mesas 24. It should be understood that while a single mesa 24 is illustrated in the figures for simplicity, a plurality of spaced apart mesas 24 are formed on substrate 20 interconnected by bridges 25. Bridges 25 are formed of the lower resistivity material including layers 22 and 23. The formation of mesas 24 and bridges 25 is accomplished using conventional masking techniques such as forming a metal etch mask (not shown) using photoresist technology, etching layers 22 and 23 and removing the metal etch mask.

Figure 4:
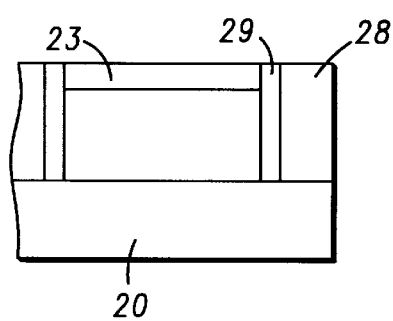
Figure 3:
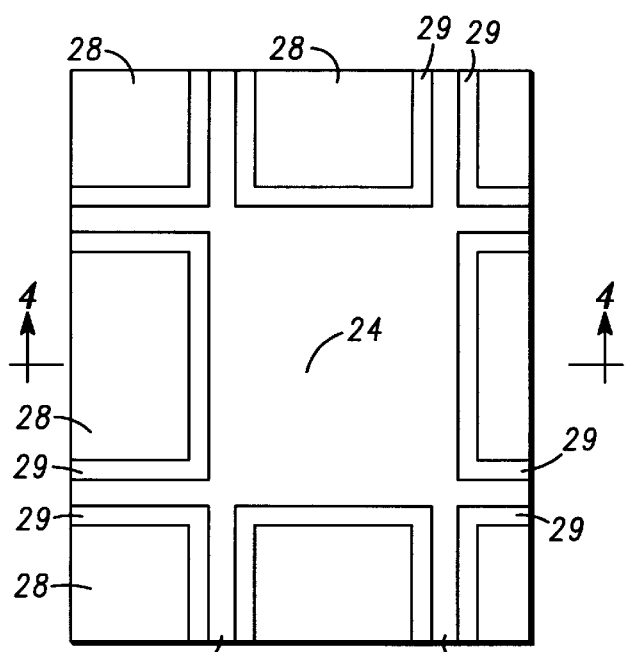

Referring to FIGS. 3 and 4, a dielectric material is formed on substrate 20 between mesas 24 and bridges 25. The formation of the dielectric material can include any material and any process convenient for the purpose. In this preferred embodiment, a blanket layer of dielectric material such as SiO$_2$ is deposited over the entire structure. The structure is then masked and etched, using any conventional technique, to remove the SiO$_2$ from overlying mesas 24 and bridges 25 leaving portions 28. The etch results in gaps adjacent mesas 24 and bridges 25. These gaps are filled and the structure planarized with glass 29 utilizing a spin on glass technique. While a specific planarization procedure has been described above, it will be understood that any techniques for planarizing the structure can be used. The planarization is convenient for subsequent semiconductor processing steps.

Figure 6:
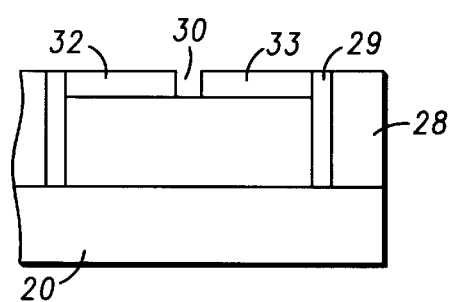
Figure 5:
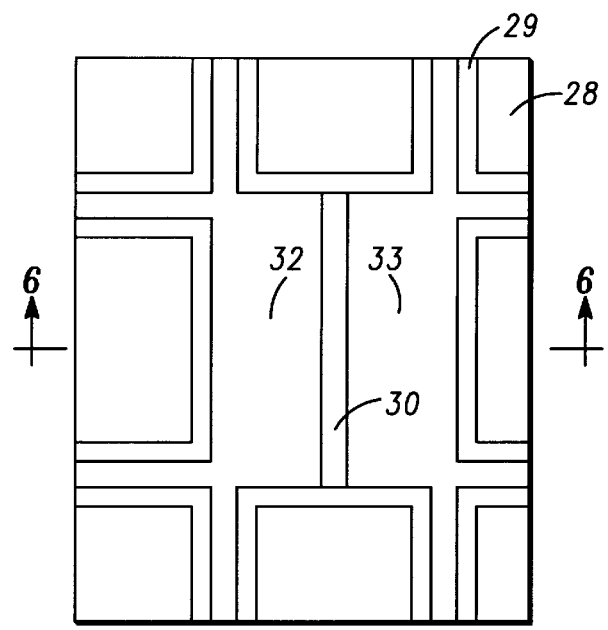

Referring now to FIGS. 5 and 6, initial steps in a process of forming semiconductor devices in mesas 24 employing electron beam lithography are illustrated. A layer of photoresist is deposited on the entire structure and patterned using an electron beam in accordance with conventional electron beam lithography. Here it should be noted that the very high resistivity material of substrate 20 isolating mesa structures 24 would cause a charge to accumulate during the electron beam writing step. As the accumulated charge in the mesa becomes larger, the electron beam can be deflected resulting in pattern distortion. Distortion of the electron beam degrades both resolution and registration. Charge accumulation is avoided in the present process by the low resistivity material of bridges 25 which interconnect mesas 24, dispersing the charge throughout the entire structure and conducting the charge to the edges of the structure where it can be entirely removed from the structure.

Still referring to FIGS. 5 and 6, after the electron beam writing step, the exposed photo resist is removed prior to depositing a metal etch mask (not shown). Using the etch mask, a channel 30 is etched through layer 22 down to layer 23, bisecting mesa 24 into portions 32 and 33. The etch mask is then removed.

Figure 8:
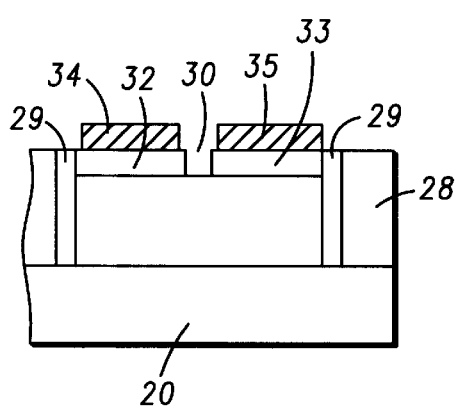
Figure 7:
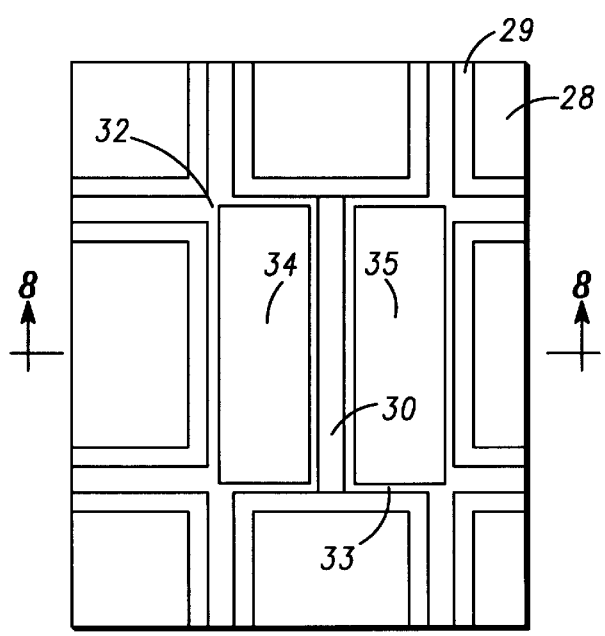

Turning now to FIGS. 7 and 8, ohmic metal contacts 34 and 35 are formed on portion 32 and 33. In the preferred embodiment, ohmic contact lithography is employed to facilitate this process. After liftoff of excess ohmic metal, ohmic contacts 34 and 35, which remain after liftoff, are annealed to reduce contact resistance. In the present description of a preferred embodiment, the semiconductor device being fabricated is a MESFET wherein contacts 34 and 35 define a source and drain, respectively. It should be understood, however, that the novel process being described can be utilized to fabricate other devices formed using mesa structures.

Figure 10:
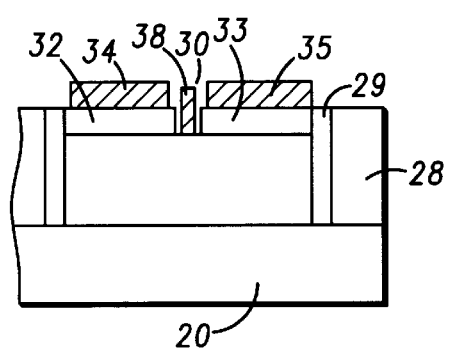
Figure 9:
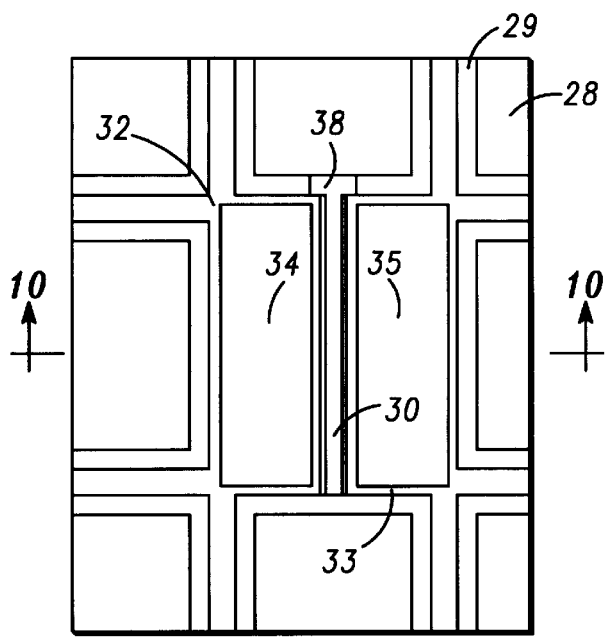

With reference to FIGS. 9 and 10, a gate contact 38 is formed using electron beam lithography. A layer of photoresist is deposited on the entire structure and patterned using an electron beam in accordance with conventional electron beam lithography. After the electron beam writing step, the exposed photo resist is removed leaving a mask (not shown). Using the mask, a blanket layer of gate metal is deposited over the entire structure. Using a conventional liftoff process excess gate metal is removed leaving gate contact 38 on layer 22 in channel 30 between portions 32 and 33. During this procedure, bridges 25 interconnecting mesas 24 continue to disperse charges developed during electron beam lithography.

Figure 12:
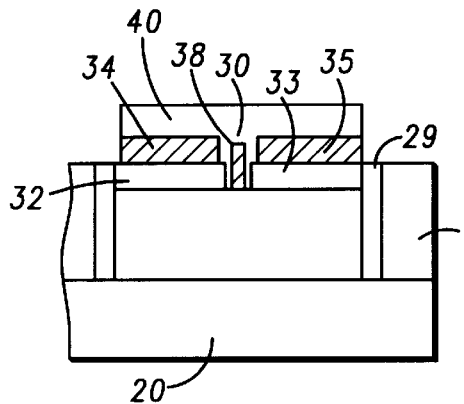
Figure 11:
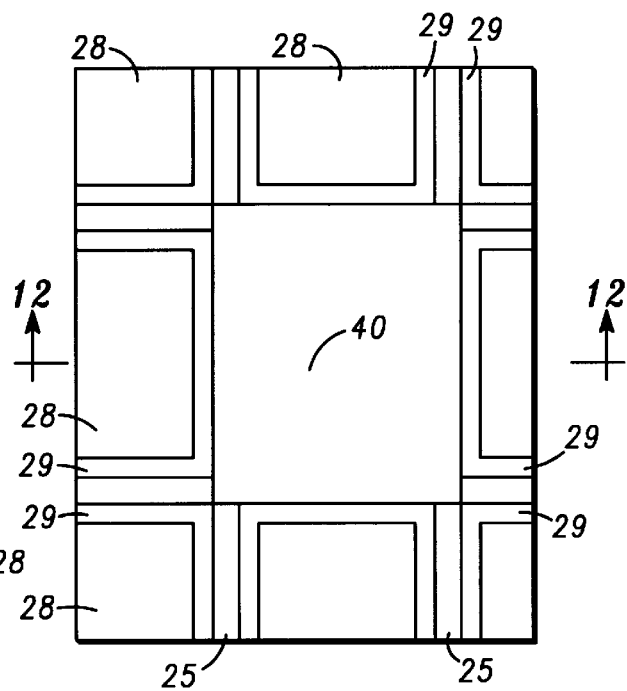
Figure 13:
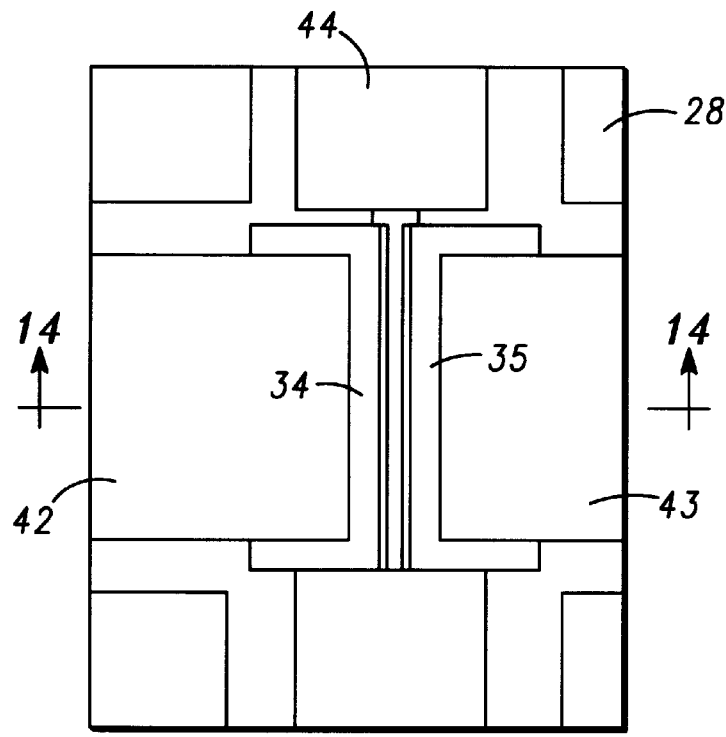
Figure 14:
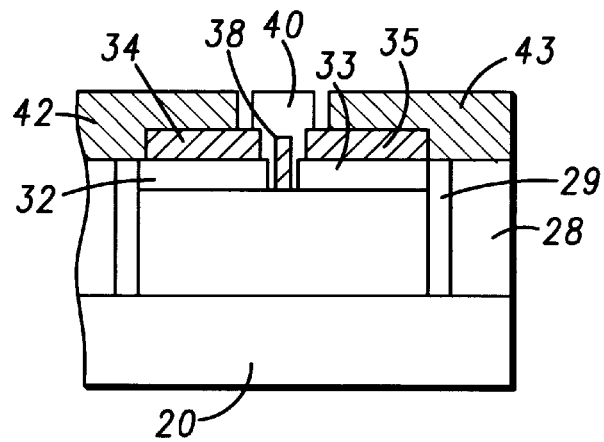

Turning to FIGS. 11 and 12, device formation has been essentially completed and no additional electron beam lithography will be performed. Therefore, bridges 25 are removed to isolate each mesa 24 and the semiconductor device or devices formed thereon. Removal of bridges 25 can be accomplished by etching or sawing during die separation. In the embodiment illustrated, after formation of gate contact 38, bridges 25 are removed by selectively etching layers 22 and 23 of bridges 25. Subsequent to etching, in this embodiment, a dielectric material 40 is deposited over each device for protection. Windows are opened through dielectric material 40 in communication with contacts 34 and 35 and gate contact 38. This process can be performed utilizing conventional etching techniques. External contacts 42, 43 and 44 are formed in electrical contact with contacts 34 and 35, and gate contact 38, respectively, by employing conventional liftoff techniques. (See FIGS. 13 and 14). In the event that bridges 25 are still intact after the final metalization step for external contact formation, intermesa contact is broken during die separation, such as by sawing.

Thus provided, is a new and improved method of employing electron beam lithography on very high resistivity substrates with electrically isolated mesa structures, while maintaining high resolution and accurate pattern registration.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of performing electron beam lithography on high resistivity structures comprising the steps of:

providing a high resistivity structure;

etching the structure to form mesas;

electrically interconnecting the mesas with lower resistivity material;

forming semiconductor devices in the mesas employing electron beam lithography, charges generated by electron beam lithography being dispersed by the lower resistivity material thereby preventing charge accumulation on the mesas; and removing the lower resistivity material.

2. A method as claimed in claim 1 wherein the step of providing a high resistivity structure includes:

providing a high resistivity substrate;

forming a first layer of doped material on the substrate; and forming a second layer of doped material on the first layer.

3. A method as claimed in claim 2 wherein the step of etching the structure to form mesas includes etching the first and second layers.

4. A method as claimed in claim 3 wherein the step of etching the structure to form mesas includes etching to form bridges in the first and second layers to electrically interconnect the mesas.

5. A method as claimed in claim 4 wherein the first layer and the second layer are formed by one of epitaxially growing, ion implanting, and diffusing.

6. A method as claimed in claim 2 wherein the high resistivity substrate includes one of silicon carbide, gallium nitride, sapphire, spinel, silicon dioxide on silicon, and glass.

7. A method as claimed in claim 1 wherein the step of removing the lower resistivity material includes etching the lower resistivity material.

8. A method as claimed in claim 1 wherein the step of removing the lower resistivity material includes sawing during die separation.

9. A method of performing electron beam lithography on high resistivity structures comprising the steps of:

providing a high resistivity substrate;

forming semiconductor material on the substrate;

etching the semiconductor material to form mesas with electrically interconnecting bridges between the mesas;

forming semiconductor devices in the mesas employing electron beam lithography, charges generated by electron beam lithography being dispersed along the interconnecting bridges thereby preventing charge accumulation on the mesas; and removing the bridges.

10. A method as claimed in claim 9 wherein the step of forming the semiconductor material includes:

forming a first layer of doped material on the substrate; and forming a second layer of doped material on the first layer.

11. A method as claimed in claim 10 wherein the step of etching the structure to form mesas includes etching the first and second layers.

12. A method as claimed in claim 11 wherein the first layer and the second layer are formed by one of epitaxially growing, ion implanting, and diffusing.

13. A method as claimed in claim 9 wherein the step of removing the bridges includes etching the bridges.

14. A method as claimed in claim 9 wherein the step of removing the bridges includes sawing during die separation.

15. A method as claimed in claim 9 wherein the high resistivity substrate includes one of silicon carbide, gallium nitride, sapphire, spinel, silicon dioxide on silicon, and glass.

16. A method of performing electron beam lithography on high resistivity structures comprising the steps of:

provding a high resistivity substrate;

forming semiconductor material on the substrate;

etching the semiconductor material to form mesas;

forming electrically interconnecting bridges between the mesas;

forming semiconductor devices in the mesas employing electron beam lithography, charges generated by electron beam lithography being dispersed along the interconnecting bridges thereby preventing charge accumulation on the mesas; and removing the bridges.

17. A method as claimed in claim 16 wherein the step of forming the semiconductor material includes:

forming a first layer of doped material on the substrate; and forming a second layer of doped material on the first layer.

18. A method as claimed in claim 17 wherein the step of etching the semiconductor material to form mesas includes etching the first and second layers.

19. A method as claimed in claim 18 wherein the step of etching the semiconductor material to form mesas includes etching the semiconductor material to form the bridges in the first and second layers to electrically interconnect the mesas.

20. A method as claimed in claim 16 wherein the step of removing the bridges includes etching the bridges.

21. A method as claimed in claim 16 wherein the step of removing the bridges includes sawing during die separation.

22. A method as claimed in claim 16 wherein the high resistivity substrate includes one of silicon carbide, gallium nitride, sapphire, spinel, silicon dioxide on silicon, and glass.

\* \* \* \* \*